(12) United States Patent
Kwak

(10) Patent No.: US 11,652,123 B2
(45) Date of Patent: May 16, 2023

(54) IMAGE SENSING DEVICE

(71) Applicant: SK hynix Inc., Icheon-si (KR)

(72) Inventor: Ho Young Kwak, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 301 days.

(21) Appl. No.: 16/884,724

(22) Filed: May 27, 2020

(65) Prior Publication Data

US 2021/0183919 A1     Jun. 17, 2021

(30) Foreign Application Priority Data

Dec. 12, 2019     (KR) .................... 10-2019-0165596

(51) Int. Cl.
  *H01L 27/146*     (2006.01)

(52) U.S. Cl.
  CPC .... *H01L 27/1463* (2013.01); *H01L 27/14609* (2013.01); *H01L 27/14627* (2013.01)

(58) Field of Classification Search
  CPC .................. H01L 27/1463; H01L 27/14609
  See application file for complete search history.

(56) References Cited

U.S. PATENT DOCUMENTS

| | | | | |
|---|---|---|---|---|
| 11,411,027 B2* | 8/2022 | Poikonen | ............ | H01L 27/1461 |
| 2005/0285165 A1* | 12/2005 | Ohkawa | ............ | H01L 27/14609 |
| | | | | 257/292 |
| 2012/0038904 A1* | 2/2012 | Fossum | ............ | H01L 27/14603 |
| | | | | 257/E27.154 |
| 2015/0115336 A1* | 4/2015 | Sogoh | ............... | H01L 27/14612 |
| | | | | 257/291 |
| 2017/0194367 A1* | 7/2017 | Fotopoulou | ........... | G01S 7/4863 |
| 2018/0219046 A1* | 8/2018 | Yamaguchi | ......... | H01L 27/1463 |
| 2019/0018116 A1 | 1/2019 | Seliuchenko | | |
| 2020/0020731 A1* | 1/2020 | Watanabe | ............. | G01S 7/4863 |
| 2020/0028017 A1* | 1/2020 | Imoto | .................... | H01L 31/101 |
| 2020/0382737 A1* | 12/2020 | Kajiwara | .......... | H01L 27/14831 |
| 2022/0059584 A1* | 2/2022 | Hirase | ............... | H01L 27/14609 |
| 2022/0208815 A1* | 6/2022 | Jang | .................. | H01L 27/14612 |

FOREIGN PATENT DOCUMENTS

KR     10-2018-0028752 A     3/2018

* cited by examiner

*Primary Examiner* — Eugene Lee
(74) *Attorney, Agent, or Firm* — Perkins Coie LLP

(57) ABSTRACT

An image sensing device is disclosed. The image sensing device includes a semiconductor substrate configured to generate charge carriers in response to light incident, a plurality of control regions supported by the semiconductor substrate and configured to cause majority carrier currents in the semiconductor substrate to control movement of minority carriers, and a plurality of detection regions formed adjacent to the control regions and configured to capture the minority carriers moving in the semiconductor substrate. Each of the control regions includes an upper portion, a lower portion, and a middle portion disposed between the upper portion and the lower portion. The middle portion has a smaller horizontal cross-sectional profile than each of the upper portion and the lower portion.

17 Claims, 5 Drawing Sheets

IMAGE SENSING DEVICE

CROSS-REFERENCE TO RELATED APPLICATION

This patent document claims the priority and benefits of Korean patent application No. 10-2019-0165596, filed on Dec. 12, 2019, which is incorporated by reference in its entirety as part of the disclosure of this patent document.

TECHNICAL FIELD

The technology and implementations disclosed in this patent document generally relate to an image sensing device.

BACKGROUND

An image sensor is a device for converting an optical image into electrical signals. With the recent development of automotive, medical, computer and communication industries, the demand for high-performance image sensors is increasing in various devices such as digital cameras, camcorders, personal communication systems (PCSs), game consoles, surveillance cameras, medical micro-cameras, robots, etc.

One very common type of image sensing device is a CCD (charge coupled device)-based image sensor, which has dominated the field of image sensors for a long time, and another common type of image sensing device is a CMOS (complementary metal oxide semiconductor)-based image sensor, which is now dominating the field of image sensors. CMOS image sensors are now widely used due to certain advantages over the CCD image sensors, including lower power consumption, lower production costs, and smaller size. Such characteristics of the CMOS image sensor make these sensors better suited for implementations in mobile devices such as smartphones, digital cameras, etc.

SUMMARY

Various embodiments of the disclosed technology relate to an image sensing device for improving the sensing speed by increasing mobility of holes in a substrate.

In an embodiment of the disclosed technology, an image sensing device may include a semiconductor substrate configured to generate charge carriers in response to light incident, a plurality of control regions supported by the semiconductor substrate and configured to cause majority carrier currents in the semiconductor substrate to control movement of minority carriers, and a plurality of detection regions formed adjacent to the control regions and configured to capture the minority carriers moving in the semiconductor substrate. Each of the control regions may include an upper portion, a lower portion, and a middle portion disposed between the upper portion and the lower portion. The middle portion may have a smaller horizontal cross-sectional profile than each of the upper portion and the lower portion.

In another embodiment of the disclosed technology, an image sensing device may include a semiconductor, a pixel array supported by the semiconductor substrate and structured to include a plurality of unit pixels consecutively arranged in rows and columns, the unit pixels structured to generate carriers by a photoelectric conversion of incident light and to detect minority carriers in the generated carriers. The unit pixels may include a first control region and a second control region configured to generate currents of majority carriers in a direction in the semiconductor substrate to cause the minority carriers to move in a direction opposite to the majority carrier currents in the semiconductor substrate, and a first detection region and a second detection region configured to capture the minority carriers that move in the semiconductor substrate by the majority carrier currents. Each of the first control region and the second control region includes an upper portion and a lower portion with a substantially same horizontal cross-sectional profile, and a middle region disposed between the upper portion and the lower portion with a horizontal cross-sectional profile that is different in size from that of each of the upper portion and the lower portion.

In another embodiment of the disclosed technology, an image sensing device may include a semiconductor substrate including a first surface and a second surface facing the first surface, and configured to generate minority carriers in response to light incident upon the first surface, a plurality of control regions disposed over the second surface, and configured to control movement of the minority carriers by generating majority carrier currents in the semiconductor substrate, and a plurality of detection regions located adjacent to the control regions, and configured to capture the minority carriers moving by the majority carrier currents. Each of the control regions may include an upper portion, a lower portion, and a middle portion disposed between the upper portion and the lower portion. The middle portion may have a smaller horizontal cross-sectional view than each of the upper portion and the lower portion.

In another embodiment of the disclosed technology, an image sensing device may include a pixel array including a plurality of unit pixels consecutively arranged not only in a first direction but also in a second direction perpendicular to the first direction, such that the unit pixels generate and detect minority carriers by performing photoelectric conversion of light incident upon a semiconductor substrate. The unit pixels may include a first control region and a second control region configured to control movement of the minority carriers by generating majority carrier currents in the semiconductor substrate, and a first detection region and a second detection region configured to capture the minority carriers that move in the semiconductor substrate by the majority carrier currents. In each of the first control region and the second control region, an upper portion and a lower portion have a substantially same horizontal cross-sectional view, and a middle region disposed between the upper portion and the lower portion has a horizontal cross-sectional view that is different in size from that of each of the upper portion and the lower portion.

It is to be understood that both the foregoing general description and the following detailed description of the disclosed technology are illustrative and explanatory and are intended to provide further explanation of the disclosure as claimed.

DETAILED DESCRIPTION

In order to acquire a three-dimensional (3D) image using the image sensor, color information of the 3D image and the distance (or depth) between a target object and the image sensor are needed.

In acquiring information associated with the distance between the target object and the image sensor, the image sensor can use a passive method or an active method.

The passive method may calculate the distance between the target object and the image sensor using only image information of the target object without providing a light signal to the target object. The passive method can be applied to a stereo camera.

Unlike the passive method, the active method can measure the distance between the target object and the image sensor using an artificial light signal provided by a laser or an LED. Examples of such an active method may include a triangulation method and a time-of-flight (TOF) method. After a light signal has been sent to the target from a light source (e.g., a laser source or an LED) spaced apart from the image sensor by a predetermined distance, the triangulation method may detect light reflected from the target object and calculate the distance between the target object and the image sensor using the detected light. After a light signal has been sent from the light source to the target object, the TOF method may measure the round trip time of the light signal, which is reflected from the target object and returns to the image sensor, to calculate the distance between the target object and the image sensor.

This patent document provides implementations and examples of an image sensing device that can improve the sensing speed of the image sensing device by increasing mobility of holes in a substrate. In some implementations of the disclosed technology, an image sensing device can increase mobility of holes in a current-assisted photonic demodulator (CAPD) pixel structure, resulting in increased light efficiency of the image sensing device. The disclosed technology provides various implementations of an image sensing device which can increase the sensing speed of the sensing device by increasing mobility of holes.

Reference will now be made in detail to certain embodiments, examples of which are illustrated in the accompanying drawings. Wherever possible, the same reference numbers will be used throughout the drawings to refer to the same or similar parts. In the following description, a detailed description of related known configurations or functions incorporated herein will be omitted to avoid obscuring the subject matter.

Figure 1:
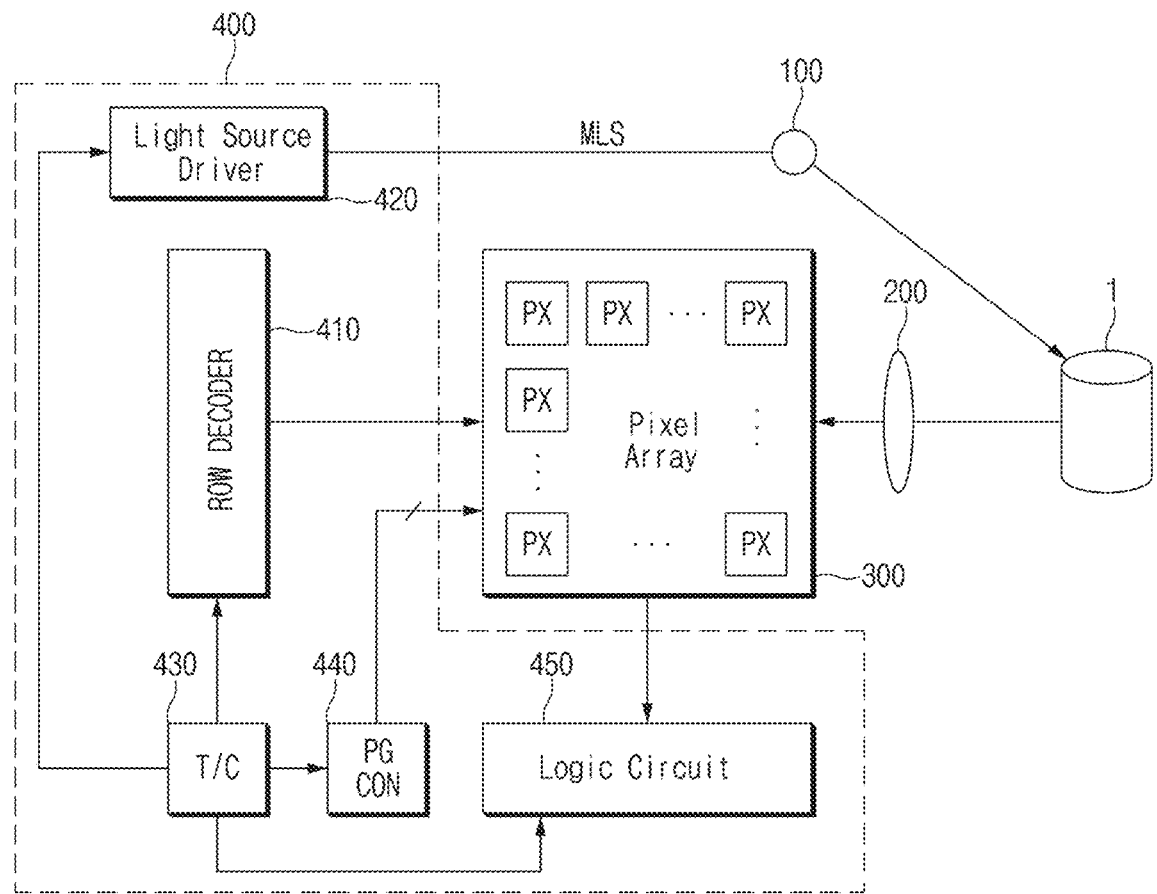
FIG. 1 is a block diagram illustrating an example of an image sensing device based on some implementations of the disclosed technology.

FIG. 1 is a block diagram illustrating an example of an image sensing device based on some implementations of the disclosed technology.

In some implementations, the image sensing device may measure the distance using the time-of-flight (TOF) principle. In one example, a TOF sensor can work by illuminating a target object with a modulated light source and observing the reflected light. The phase shift between the illumination and the reflection is measured and translated to a distance between the target object and the TOF sensor. The image sensing device may include a light source 100, a lens module 200, a pixel array 300, and a control circuit 400.

The light source 100 may emit light to a target object 1 upon receiving a clock signal MLS from the control circuit 400. In one example, the light source 100 may be a laser diode (LD) or a light emitting diode (LED) for emitting infrared light or visible light. In another example, the light source 100 may be any one of a near-infrared laser (NIR), a point light source, a monochromatic light source combined with a white lamp or a monochromator, and a combination of other laser sources. For example, the light source 100 may emit infrared light having a wavelength of 800 nm to 1000 nm. Although FIG. 1 shows only one light source 100 for convenience of description, the scope or spirit of the disclosed technology is not limited thereto, and a plurality of light sources may also be arranged in the vicinity of the lens module 200.

The lens module 200 may collect light reflected from the target object 1, and may allow the collected light to be focused onto pixels (PXs) of the pixel array 300. The lens module 200 may include a focusing lens having a surface formed of glass or plastic or another cylindrical optical element having a surface formed of glass or plastic. The lens module 200 may include a focusing lens having a convex structure.

The pixel array 300 may include unit pixels (PXs) consecutively arranged in a two-dimensional (2D) array in which unit pixels are arranged in rows and columns. The unit pixels (PXs) may be formed in a semiconductor substrate. Each unit pixel (PX) may convert light received through the lens module 200 into an electrical signal corresponding to the received light and output the electrical signal as a pixel signal. In some implementations, at least one of the unit pixels (PX) may generate a pixel signal that indicates the distance to the target object 1, instead of indicating a color of the target object 1. The unit pixel (PX) that generates such a pixel signal may be a current-assisted photonic demodulator (CAPD) pixel for detecting charge carriers generated in a substrate by incident light, using a modulated electric filed to guide the photo-generated charge carriers. For example, each unit pixel (PX) may include a detection region and a control region. In a doped semiconductor region, out of the n-type and p-type charge carriers, one type of charges carriers is the majority carriers than the other type by the design of the dopants in the doped region. For example, the detection region may be configured to detect minority carriers (e.g., electrons in an p-doped region) generated in the unit pixel by incident light, and the corresponding control region may form majority carrier currents (e.g., hole current) for directing electrons to the detection region in the substrate. In this and other implementations, the control region may have a pot-shaped or gourd-shaped cross-sectional profile to increase mobility of majority carriers (e.g., holes in an p-dope region).

The control circuit 400 may control the light source 100 so that light can be sent to the target object 1 at the right timing. The control circuit 400 may also process each pixel signal corresponding to the light reflected from the target object 1 by operating unit pixels (PXs) of the pixel array 300, and may measure the distance to the surface of the target object 1.

In some implementations, the control circuit 400 may include a row decoder 410, a light source driver 420, a timing controller 430, a photogate controller 440, and a logic circuit 450.

The row decoder 410 may activate unit pixels (PXs) of the pixel array 300 in response to a timing signal generated from the timing controller 430. For example, the row decoder 410 may generate a control signal capable of selecting at least one of the plurality of row lines. The control signal may include a selection signal for controlling the selection transistor and a transmission (Tx) signal for controlling transfer gates.

The light source driver 420 may generate a clock signal MLS capable of operating the light source 100 in response to a control signal from the timing controller 430. The light source driver 420 may provide either the clock signal MLS or information about the clock signal MLS to the photogate controller 440.

The timing controller 430 may generate timing signals to control the row decoder 410, the light source driver 420, the photogate controller 440, and the logic circuit 450.

The photogate controller 440 may generate photogate control signals in response to a control signal of the timing controller 430, and may apply the photogate control signals to the pixel array 300. Although FIG. 1 illustrates only the photogate controller 440 for convenience of description, the control circuit 400 may include, in lieu of or in addition to the photogate controller 440, a photodiode controller that generates a plurality of photodiode control signals in response to a control signal of the timing controller 430 and then transmits the photodiode control signals to the pixel array 300.

The logic circuit 450 may process pixel signals received from the pixel array 300 based on the timing signals of the timing controller 430, and may thus calculate the distance to the target object 1. The logic circuit 450 may include a correlated double sampler (CDS) circuit for performing correlated double sampling (CDS) on the pixel signals generated from the pixel array 300. In addition, the logic circuit 450 may include an analog-to-digital converter (ADC) for converting output signals of the CDS circuit into digital signals.

Figure 2:
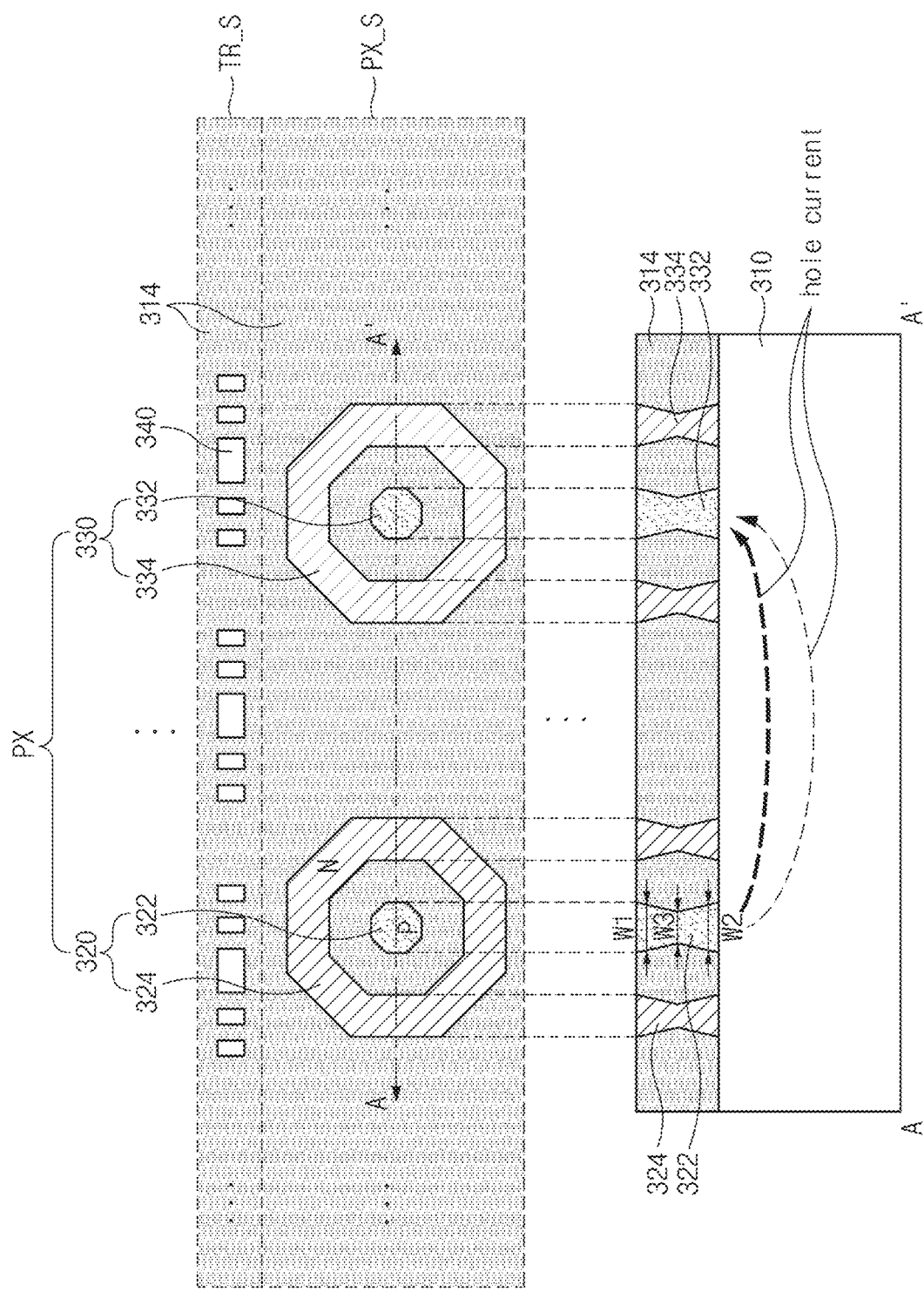
FIG. 2 illustrates a plan view and a cross-sectional view of a unit pixel contained in a pixel array shown in FIG. 1 based on some implementations of the disclosed technology.

FIG. 2 illustrates a plan view and a cross-sectional view of one example of the unit pixel contained in the pixel array 300 shown in FIG. 1 based on some implementations of the disclosed technology.

In some implementations, the pixel array 300 may include unit pixels (PXs) consecutively arranged in first and second direction. In one example, the second direction is perpendicular to the first direction.

In some implementations, the pixel array 300 may include a plurality of sub-pixel arrays (PX_S) with each sub-pixel array including adjacent unit pixels and a plurality of pixel transistor arrays (TR_S).

Each sub-pixel array (PX_S) may include, one implementation, a plurality of unit pixels (PXs) arranged in a first direction as a one-dimensional sub-pixel array. Each unit pixel (PX) may include a pair of signal detectors 320 and 330 located contiguous or adjacent to each other.

The substrate 310 may include a semiconductor substrate with or without impurities or doping materials). For example, the substrate 310 may include a P-type semiconductor substrate with its majority carriers being holes and minority carriers being electrons. The substrate 310 may include a first surface upon which light is incident and a second surface facing away from the first surface. The signal detectors 320 and 330 may be formed at the second surface.

The signal detector 320 may include a control region 322 and a detection region 324. The other signal detector 330 may include a control region 332 and a detection region 334.

Each of the control regions 322 and 332 may include a P-type impurity region. Each of the control regions 322 and 332 may include a P+ diffusion region and a P-well. The control regions 322 and 332 may be coupled to the row decoder 410 through conductive lines, and may thus receive via such conductive lines a demodulation control signal from the row decoder 410. For example, different levels of control voltages acting as different demodulation control signals may be applied to the control regions 322 and 332. Majority carriers (e.g., holes) may move toward a low voltage region in the substrate 310 by a potential or voltage difference between the control regions 322 and 332, and minority carriers (e.g., electrons) may move in the direction opposite to majority carrier currents (hole currents) generated in the substrate 310 by incident light.

Each of the detection regions 324 and 334 may include an N-type impurity region. Each of the detection regions 324 and 334 may include an N+ diffusion region and a N-well. In each of the signal detectors 320 and 330, the detection region 324 formed in a ring shape may surround the control region 322, and the detection region 334 formed in a ring shape may surround the control region 332. Although FIG. 2 illustrates each of the detection regions 324 and 334 is formed in an octagonal ring shape by way of example, the scope or spirit of the disclosed technology is not limited thereto, and each detection region 324 or 334 may also be formed in a circular shape or in any polygonal shape. In addition, the detection region 324 may not completely surround the control region 322 without completely forming a ring shape, and at least a portion of the detection region 324 may be isolated. The detection region 334 may have a shape that does not completely surround the control region 332, leaving at least a portion of the detection region 334 disconnected from other portions of the detection region 334.

When minority carriers (e.g., electrons) generated by light incident upon the substrate 310 are moving by majority carrier currents, the detection regions 324 and 334 may capture the minority carriers. The voltages that are applied to the detection regions 324 and 334 may be the same as one another. In this case, the voltages applied to the detection regions 324 and 334 may be higher than a voltage applied to the control region 322, and may be less than a voltage applied to the control region 332.

The control regions 322 and 332 and the detection regions 324 and 334 are formed in active regions, which may be defined by a device isolation film 314. The active region in which the control regions 322 and 332 are formed and the other active region in which the detection regions 324 and 334 are formed may be isolated from each other by the device isolation film 314. The control regions 322 and 332 and the detection regions 324 and 334 may be formed by implanting P-type impurities or N-type impurities in the active regions isolated by the device isolation film 314. The device isolation film 314 may be formed in a shallow trench isolation (STI) structure in which a trench formed by etching the second surface of the substrate 310 to a predetermined depth is filled with an insulation material. The device isolation film 314 may include an oxide film.

As shown in the cross-sectional view of FIG. 2, each of the control regions 322 and 332 implemented based on some embodiments of the disclosed technology may include an upper portion including a top surface, a lower portion including a bottom surface, and a middle portion disposed between the upper portion and the lower portion. In some implementations, the width (W1) of the upper portion may be identical or similar to the width (W2) of the lower portion, and the width (W3) of the middle portion may be narrower than each of the width (W1) of the upper portion and the width (W2) of the lower portion. In some implementations, each of the control regions 322 and 332 may be formed in hourglass shape. For example, horizontal cross-sectional profiles of the upper portion and the lower portion of each of the control regions 322 and 332 are identical or similar to each other whereas a horizontal cross-sectional profile of the middle portion of each of the control regions 322 and 332 is narrower than the horizontal cross-sectional profile of each of the upper portion and the lower portion of each of the control regions 322 and 332. In an implementation, the width (W3) of the middle portion may be about half the width (W1) of the upper portion and the width (W2) of the lower portion (W3≈½×W1, W3≈½×W2).

The vertical cross-sectional view of each of the detection regions 324 and 334 may be substantially identical to the vertical cross-sectional view of each of the control regions 322 and 332 as shown in FIG. 2.

The pixel transistor array (TR_S) may be located adjacent to the sub-pixel array (PX_S) in a second direction. The pixel transistor array (TR_S) may include a plurality of pixel transistors 340 arranged in a first direction. Pixel transistors 340 contained in the pixel transistor array (TR_S) may read out pixel signals from the unit pixels (PX) of the neighboring sub-pixel array (PX_S) to output the read pixel signals to the column line. For example, the pixel transistors 340 may read out pixel signals corresponding to minority carriers (e.g., electrons) captured by the detection regions 324 and 334.

The pixel transistors 340 may include a transfer transistor, a reset transistor, a source follower transistor, and a selection transistor that are arranged in the first direction. The pixel transistors 340 may be formed in the active region defined by the device isolation film 314.

The transfer transistor may be coupled to the detection regions 324 and 334 to pass charge carriers captured by the detection regions 324 and 334 to the floating diffusion (FD) region based on a transmission control signal. The reset transistor may reset the floating diffusion (FD) region based on a reset signal. The source follower transistor may generate a pixel signal corresponding to the voltage level at the floating diffusion (FD) region. The selection transistor may output the pixel signal generated from the source follower transistor to the column line according to a selection signal. Pixel signals corresponding to signal carriers captured by the detection region 324 and pixel signals corresponding to signal carriers captured by the other detection region 334 may be output through different column lines. The transmission control signal, the reset signal, and the selection signal may be received from the row decoder 410.

A lens layer (not shown) for allowing incident light to converge upon the substrate 310 may be formed over the first surface of the substrate 310. The lens layer may include a plurality of microlenses formed per unit pixel (PX).

Conductive lines may be formed over the second surface of the substrate 310. Each of the conductive lines may include aluminum (Al), copper (Cu), or tungsten (W), or a combination of two or more of Al, Cu, and W. The conductive lines may be coupled to the control regions 322 and 332, the detection regions 324 and 334 or the pixel transistors 340.

The electrons generated by incident light in the unit pixel shown in FIG. 2 can be detected as will be discussed below with reference to the attached drawings.

In an example scenario, a first control voltage (e.g., 2V) is applied to the first control region 322, a second control voltage (e.g., 0V) is applied to the second control region 332, and a detection voltage (e.g., 1V) is applied to each of the first detection region 324 and the second detection region 334.

A voltage difference between the first control voltage and the second control voltage may create an electric field in the direction from the first control region 322 to the second control region 332 in the substrate 310. The electric field causes holes corresponding to majority carriers created in the substrate 310 to move from one place to another, such that a hole current flowing from the first control region 322 to the second control region 332 may be formed in the substrate 310.

Such a hole current may cause electrons generated in the substrate 310 by such incident light to move to the first control region 322.

In this case, provided that the vertical cross-sectional profile of each of the control regions 322 and 332 is formed in a hourglass shape as shown in FIG. 2, a change in electric flux density of each of the control regions 322 and 332 can lead to an increase in the degree of mobility of holes in the upper portion of the substrate 310.

For example, in the first control region 322, the middle portion may have a smaller width to form a higher electric flux density in the middle portion, and each of the upper portion and the lower portion may have a larger width to form a lower electric flux density in each of the upper portion and the lower portion. Therefore, lines of electric forces passing through the first control region 322 may pass through the lower portion having a lower electric flux density after passing through the middle portion having a higher electric flux density.

After the electric force lines have passed through the lower portion having a lower electric flux density as described above, electric field generated by the electric force lines may converge upon the upper portion of the substrate 310. For example, the electric force lines may first converge upon the middle portion of the first control region 322 and then widely disperse in the lower portion of the first control region 322, such that the electric field generated by the electric force lines may more greatly affect the upper portion of the substrate 310. Therefore, as denoted by a bold dotted arrow shown in FIG. 2, a hole current may converge upon the upper portion of the substrate 310.

In this case, the distance the holes travel in the substrate 310 decreases, and thus electrons can more quickly move to the second control region 332. In other words, mobility of holes (i.e., movement capability) may increase such that the sensing speed of sensors can increase by increasing the moving speed of such electrons.

FIGS. 3A to 3D are cross-sectional views illustrating a method for forming the control region and the detection region shown in FIG. 2 based on some implementations of the disclosed technology.

Figure 3A:
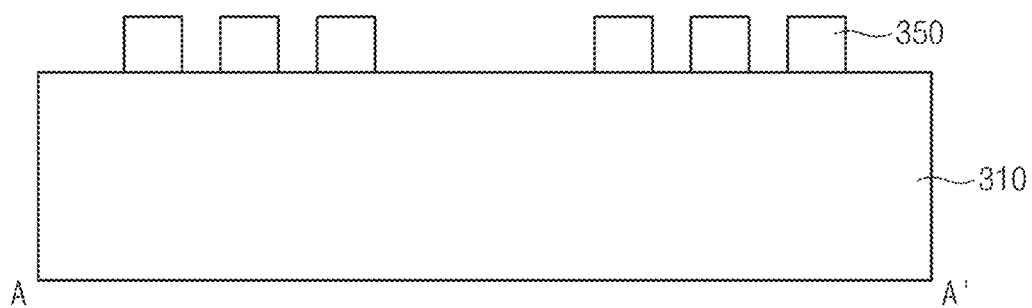
FIGS. 3A to 3D are cross-sectional views illustrating a method for forming a control region and a detection region shown in FIG. 2 based on some implementations of the disclosed technology.

Referring to FIG. 3A, a mask pattern 350 may be formed over the semiconductor substrate 310 to define the control regions 322 and 332 and the detection regions 324 and 334.

In some implementations, the mask pattern 350 may include a photoresist pattern.

Figure 3B:
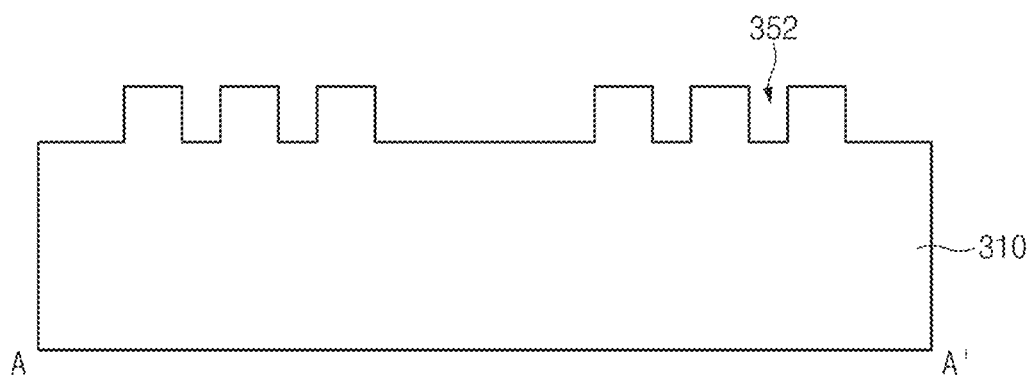

Referring to FIG. 3B, the substrate 310 may be etched to a predetermined depth using the mask pattern 350 as an etch mask, resulting in formation of a device isolation trench 352.

In some implementations, the trench 352 is formed such that the depth of the trench 352 is shallower than the height of each control region and the height of each detection region. In one example, the depth of the trench 352 may be about half the height of each control region to be formed or the height of each detection region to be formed. In other words, the device isolation trench 352 may be etched to a predetermined depth such that the depth of the trench 352 is about half the height of each of the control regions 322 and 332 or the height of each of the detection regions 324 and 334.

Figure 3C:
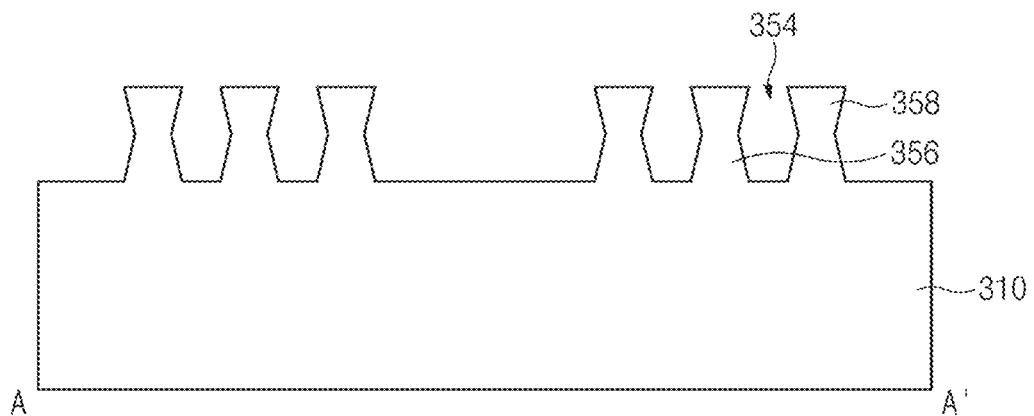

Referring to FIG. 3C, the substrate provided with the trench 352 may be immersed in KOH solution or TMAH (Tetramethylammonium Hydroxide) solution.

If the substrate is immersed in the KOH or TMAH solution, an inner surface of the trench 352 may be etched by the KOH or TMAH solution. In this case, the trench 352 may be etched such that the trench 352 has a diamond shape due to a difference in etch speed that is due to a difference in a crystalline direction of the wafer. That is, a diamond-shaped trench 354 is formed to define the active regions 356 and 358, in which the control regions and the detection regions will be formed.

Figure 3D:
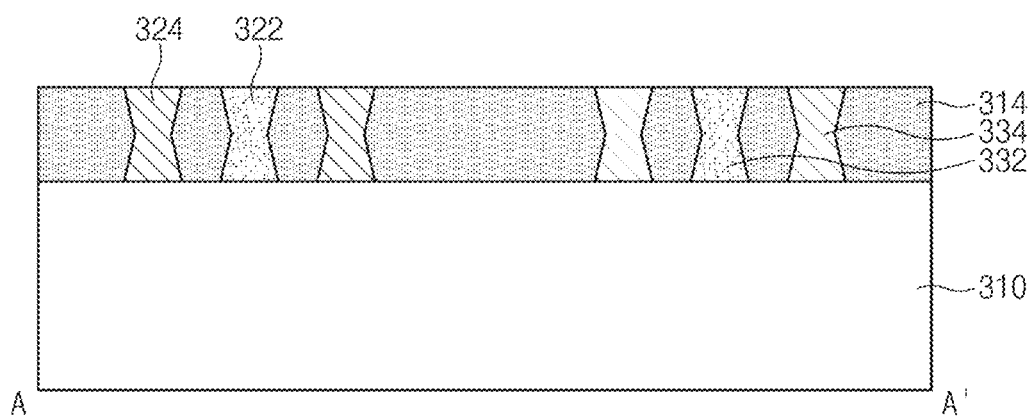

Referring to FIG. 3D, an insulation material is formed to fill the trench 354, forming a device isolation film 314, and impurities may be implanted into the active regions 356 and 358.

For example, P-type impurities may be implanted into the active region 356 to form the control regions 322 and 332. N-type impurities may be implanted into the active region 358 to form the detection regions 324 and 334.

Figure 4:
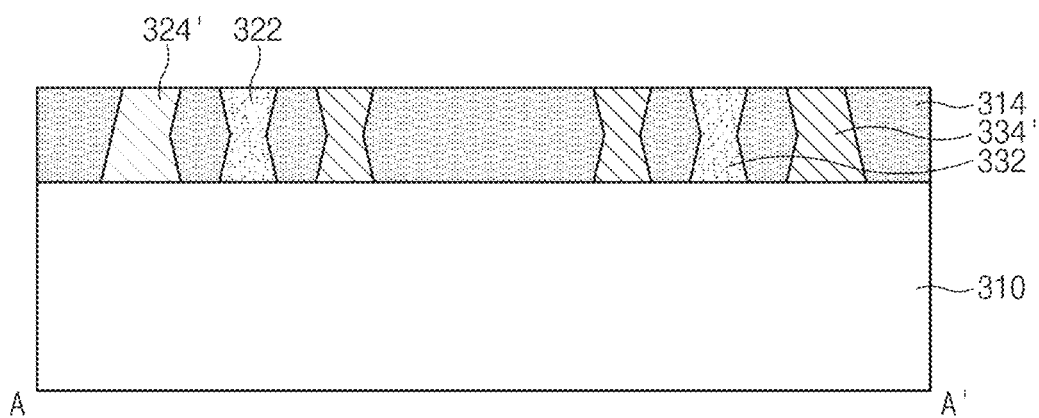
FIG. 4 is a cross-sectional view illustrating an example of a control region and a detection region based on other implementations of the disclosed technology.

FIG. 4 is a cross-sectional view illustrating an example of a control region and a detection region based on other implementations of the disclosed technology.

Although the vertical cross-sectional view of each of the control regions 322 and 332 contained in the signal detectors 320 and 330 is illustrated as having a hourglass shape as shown in FIG. 3, the scope or spirit of the disclosed technology is not limited thereto, and at least some of the detection regions 324' and 334' may have a shape that is different from the hourglass shape.

By way of example, each control region has hourglass shape for the hole current to be more effectively generated by the control regions. In some implementations, the detection region, which does not generate hole current, can have a shape that is different from hourglass shape.

Each of the detection regions 324' and 334' may have an asymmetric vertical cross-sectional profile such that a vertical cross-sectional view of the inner surface of each detection region 324' or 334' is different from a vertical cross-sectional view of the outer surface of each detection region 324' or 334'. In this case, the inner surface may refer to a side surface located adjacent to the control region, and the outer surface may refer to the other side surface located farther from the control region than the inner surface.

For example, the inner surface of each of the detection regions 324' and 334' may be formed in a concave shape in which the middle portion is concaved in the same manner as in the side surfaces of the control regions 322 and 332. The outer surface of each of the detection regions 324' and 334' may be formed in a diagonal line in which the outer surface of each detection region 324' or 334' is gradually tilted to the outside (i.e., a direction farther from the control region) in a downward direction.

As is apparent from the above description, the image sensing device according to the embodiments of the disclosed technology can increase mobility of holes in the CAPD (Current-Assisted Photonic Demodulator) pixel structure, resulting in increased light efficiency of the image sensing device.

In addition, the image sensing device according to the embodiments of the disclosed technology can increase the sensing speed of the sensing device by increasing mobility of holes.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope of the disclosure should be determined by the appended claims and their legal equivalents, not by the above description. Further, all changes coming within the meaning and equivalency range of the appended claims are intended to be embraced therein. In addition, those skilled in the art will understand that claims that are not explicitly cited in each other in the appended claims may be presented in combination as an embodiment or included as a new claim by a subsequent amendment after the application is filed.

Although a number of illustrative embodiments have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. An image sensing device comprising:
   a semiconductor substrate configured to generate charge carriers in response to incident light;
   a plurality of control regions supported by the semiconductor substrate and configured to cause majority carrier currents in the semiconductor substrate to control movement of minority carriers; and
   a plurality of detection regions formed adjacent to the control regions and configured to capture the minority carriers moving in the semiconductor substrate,
   wherein each of the control regions includes an upper portion, a lower portion, and a middle portion disposed between the upper portion and the lower portion, and
   wherein the middle portion has a smaller horizontal cross-sectional profile than each of the upper portion and the lower portion.

2. The image sensing device according to claim 1, wherein the middle portion has a width that is substantially half a width of the lower portion.

3. The image sensing device according to claim 1, wherein each of the detection regions is identical in vertical cross-sectional structure to each of the control regions.

4. The image sensing device according to claim 1, wherein a vertical cross-sectional profile of an inner surface of each detection region is different from a vertical cross-sectional profile of an outer surface of each detection region.

5. The image sensing device according to claim 1, wherein the plurality of control regions includes: first-type impurities; and a first control region and a second control region spaced apart from each other by a predetermined distance.

6. The image sensing device according to claim 5, wherein the plurality of detection regions includes: second-type impurities that are opposite in characteristics to the first-type impurities; and a first detection region surrounding the first control region and a second detection region surrounding the second control region.

7. The image sensing device according to claim 1, wherein the control regions and the detection regions are isolated from one another by a device isolation film.

8. An image sensing device comprising:
   a semiconductor substrate;
   a pixel array supported by the semiconductor substrate and structured to include a plurality of unit pixels consecutively arranged in rows and columns, the unit pixels structured to generate carriers by a photoelectric conversion of incident light and to detect minority carriers in the generated carriers, wherein the unit pixels include:
- a first control region and a second control region configured to generate currents of majority carriers in a direction in the semiconductor substrate to cause the minority carriers to move in a direction opposite to the majority carrier currents in the semiconductor substrate; and
- a first detection region and a second detection region configured to capture the minority carriers that move in the semiconductor substrate by the majority carrier currents,
  wherein each of the first control region and the second control region includes an upper portion and a lower portion with a substantially same horizontal cross-sectional profile and size, and a middle region disposed between the upper portion and the lower portion with a horizontal cross-sectional profile that is different in size from that of each of the upper portion and the lower portion.

9. The image sensing device according to claim 8, wherein the middle portion has a width that is substantially half a width of each of the upper portion and the lower portion.

10. The image sensing device according to claim 8, wherein the first and second detection regions are identical in vertical cross-sectional structure to the first and second control regions.

11. The image sensing device according to claim 8, wherein a vertical cross-sectional profile of an inner surface of each of the first and second detection regions is different from a vertical cross-sectional profile of an outer surface of each of the first and second detection regions.

12. The image sensing device according to claim 8, wherein the first and second control regions include first-type impurities, and wherein the first and second control regions are spaced apart from each other by a predetermined distance.

13. The image sensing device according to claim 12, wherein:
- the first and second detection regions include second-type impurities that are opposite in characteristics to the first-type impurities;
- the first detection region is formed to surround the first control region and the second detection region is formed to surround the second control region.

14. An image sensing device comprising:
- a semiconductor substrate structured to generate charge carriers responsive to incident light;
- a control region supported by the semiconductor substrate and structured to generate currents of charge carriers of a second conductive type that moves in a direction opposite to charge carriers of a first conductive type that is opposite to the second conductive type and is generated by the semiconductor substrate; and
- a detection region formed adjacent to the control region in the semiconductor substrate to capture the charge carriers of the first conductive type,
  wherein the control region includes a first area abutting a surface of the semiconductor substrate, a second area spaced apart from the surface of the substrate and a third area that is farther from the surface of the semiconductor substrate than the second area, and
  wherein the first area is larger than the second area to form a channel for the charge carriers of the second conductive type along the surface of the substrate, and the third area is larger than the second area.

15. The image sensing device according to claim 14, wherein the first area is structured to form a lower electric flux density than the second area.

16. The image sensing device according to claim 14, wherein the control region is doped with P-type impurities and the detection region is doped with N-type impurities.

17. The image sensing device according to claim 14, wherein charge carriers of the first conductive type include electrons and the charge carriers of the second conductive type include holes.

* * * * *